(12) United States Patent
Motz

(10) Patent No.: US 7,333,915 B2
(45) Date of Patent: Feb. 19, 2008

(54) SIGNAL CONDITIONING ARRANGEMENT AND METHOD OF CONDITIONING A SIGNAL

(75) Inventor: Mario Motz, Wernberg (AT)

(73) Assignee: Infineon Technologies AG, Munich (DE)

( * ) Notice: Subject to any disclaimer, the term of this patent is extended or adjusted under 35 U.S.C. 154(b) by 93 days.

(21) Appl. No.: 11/222,184

(22) Filed: Sep. 8, 2005

(65) Prior Publication Data

US 2006/0056500 A1    Mar. 16, 2006

(30) Foreign Application Priority Data

Sep. 8, 2004    (DE) .................... 10 2004 043 461

(51) Int. Cl.
    *G04F 1/00* (2006.01)
(52) U.S. Cl. .................. 702/176; 702/57; 702/117; 702/185
(58) Field of Classification Search ............ 702/57, 702/59, 117, 176, 182, 185; 714/25, 48, 714/701, 758, 799; 375/224, 227; 341/94; 340/560, 628
    See application file for complete search history.

(56) References Cited

U.S. PATENT DOCUMENTS

| | | | |
|---|---|---|---|
| 3,719,812 A * | 3/1973 | Bishop et al. ................. 703/13 |
| 4,032,762 A * | 6/1977 | Caloyannides ............... 708/322 |
| 4,310,841 A * | 1/1982 | Olsen ..................... 340/870.43 |
| 4,608,490 A * | 8/1986 | Nagasaki et al. ......... 250/201.2 |
| 4,660,024 A * | 4/1987 | McMaster ................... 340/522 |
| 4,760,381 A * | 7/1988 | Haag ........................... 340/556 |
| 4,775,978 A * | 10/1988 | Hartness ..................... 714/770 |
| 5,463,595 A * | 10/1995 | Rodhall et al. ............... 367/93 |
| 5,761,210 A * | 6/1998 | Claydon et al. ............ 714/701 |

(Continued)

FOREIGN PATENT DOCUMENTS

DE    42 41 822 C2    12/1992

(Continued)

OTHER PUBLICATIONS

Maeng et al., 'Combined Digital/Wireless Link over the Multi-Mode Fiber with a Vertical Cavity Surface Emitting Laser', 2003, IEEE Publication, pp. 265-268.*

(Continued)

*Primary Examiner*—Carol S. W. Tsai
*Assistant Examiner*—Elias Desta
(74) *Attorney, Agent, or Firm*—Eschweiler & Associates, LLC

(57) ABSTRACT

A signal conditioning arrangement includes a sensor arrangement for sensing a measured quantity and for outputting an output signal having a first or a second logical signal state based on the measured quantity, and means for generating an evaluating impulse if the logical signal state of the output signal does not change for a maximum predetermined time duration, and which are further formed to allocate a first or a second pulse signal state, which differs from the signal state of the output signal which the output signal has during the predefined time duration, to the evaluating impulse. Furthermore, the signal conditioning arrangement includes means for combining the output signal and the evaluating impulse, with means for providing being formed to provide a conditioned output signal, the conditioned output signal having, when an evaluating impulse is present, the impulse signal state thereof and otherwise having the logical signal state of the output signal.

22 Claims, 2 Drawing Sheets

U.S. PATENT DOCUMENTS

| | | | |
|---|---|---|---|
| 7,031,828 B1 * | 4/2006 | Thompson et al. | 701/114 |
| 7,087,879 B2 * | 8/2006 | Bloehbaum | 250/214 R |
| 2006/0077998 A1 * | 4/2006 | Fredriksson | 370/466 |

FOREIGN PATENT DOCUMENTS

| | | |
|---|---|---|
| DE | 195 39 458 C2 | 10/1995 |
| DE | 195 42 086 A1 | 11/1995 |
| DE | 196 02 359 A1 | 1/1996 |
| DE | 198 11 070 C1 | 3/1998 |
| DE | 100 08 180 A1 | 2/2000 |
| DE | 100 22 013 A | 5/2000 |
| DE | 100 22 815 A1 | 5/2000 |

OTHER PUBLICATIONS

Shigematsu et al., 'A Single-Chip Fingerprint Sensor and Identifier', Dec. 1999, IEEE Publication, vol. 34, No. 12, pp. 1852-1859.*

* cited by examiner

SIGNAL CONDITIONING ARRANGEMENT AND METHOD OF CONDITIONING A SIGNAL

CROSS-REFERENCE TO RELATED APPLICATIONS

This application claims priority from German Patent Application No. 10 2004 043 461.1, which was filed on Sep. 08, 2004, and is incorporated herein by reference in its entirety.

TECHNICAL FIELD

The present invention concerns the technical field of microelectronics, and in particular the present invention concerns the partial area of the recognition of error conditions in microelectronic circuits.

BACKGROUND

In many electronic circuits, meanwhile, the reliable recognition of malfunctions is demanded, which is often referred to as "OBD function" (OBD=on-board diagnostic). Particularly in safety-relevant fields of application, such as automobile electronics, it is absolutely necessary to reliably recognize potential line breakages or so-called "chip cracks", in order to output a corresponding error signal and, for example, warn the driver of a motor vehicle of a possible malfunction of the electronic components early. Electronic circuits to be provided with such an OBD function may particularly be magnetic sensors (or Hall sensors), but also pressure/temperature or acceleration sensors with a switching output, which are to monitor a certain switching threshold.

Previously, such monitoring in sensors with an analog output was ensured by switching a depletion transistor each between the output of a corresponding sensor IC with ground and between the output of the sensor IC and the operating voltage (VDD), respectively, as this is, for example, performed and disclosed in the product TLE4990 produced by the applicant, and in DE 19751519 C2, respectively. Normally, the depletion transistors are switched off here by a charge pump and thus have no influence on the function of the IC (integrated circuit). The IC then normally outputs a voltage value in the range of 0.5 V-4.5 V at the output, when an operating voltage of VDD=5 V is applied to the IC. At line breakage in the operating voltage VDD or in the ground connection, the IC no longer gets any supply voltage and the charge pumps can no longer switch off the depletion transistors. Thus, the depletion transistors conduct and output almost uniquely 0 V or 5 V, which lies outside the useful signal range of 0.5 V-4.5 V and can thus be recognized. But such a solution has the disadvantage that a complicated circuit is to be realized, which additionally has high area consumption of semiconductor area, since depletion transistors have to be very low-ohmic, which can only be realized by forming wide channels of the depletion transistors. In addition, compatibility problems with different operating voltages at VDD of the IC and pull-up voltages at the open collector output of the IC occur.

An alternative solution in the prior art is realized in the products TLE4942 produced by the applicant or in the product TLE4976 produced by the applicant, these products using a pulsed signal output at switching edges. These sensors with switching output may output, at each switching edge, a pulse signal identifiable in the temporal shape or in the signal height (for example by a current level or a voltage level). Particularly with two or three current levels different from zero, a line breakage may be detected. But such a solution proves problematic by current interfaces being very sensitive to evaluate and such evaluation additionally being cost-intensive, since the current is inverted to a voltage via a sensing resistor, and this is evaluated with an analog-digital converter or with accurate comparators. Furthermore, by pulse code information, as output in TLE4942, only flanks but no states can be recognized. If the states were constantly sent instead of the edges, accurate temporal edge detection would no longer be possible, since for the evaluation of the pulse code information a complete pulse code sequence has to be waited for and then be evaluated, and an edge within this pulse code sequence is no longer uniquely identifiable due to the longer time duration of the pulse code sequences. In addition, the energy irradiated would be significantly increased, because the IC would send constantly and quickly recurring codes, in order to achieve a temporally high resolution.

A further possibility to recognize a malfunction in an electronic circuit is to be seen in the output of a pulse width modulated signal (PWM signal), wherein the pulse width modulated signal may include both analog and digital information. Such a solution is realized, for example, in the product HAL1500 of the Micronas company. By constantly recurring high and low signals, a function may here be checked. It is disadvantageous, however, that the temporal resolution of the signal is lower than the PWM repetition frequency. At high PWM repetition frequency, however, the spurious irradiation again increases.

SUMMARY

Starting from this prior art, it is an object of the present invention to provide a possibility for checking a function of an electronic circuit, which can be realized more easily and more inexpensively as opposed to the prior art, and which further enables more reliable and more temporally accurate recognition of malfunctions of the electronic circuit.

In accordance with a first aspect, the present invention provides a signal conditioning arrangement, having: a sensor arrangement for detecting a measured quantity and for outputting an output signal based on the measured quantity, the output signal being able to take on a first or a second logical signal state; a generator for generating an evaluating impulse in order to provide the evaluating impulse if the logical signal state of the output signal does not change for a maximum predefined time duration, and with the generator being further formed to allocate a first or a second impulse signal state, which differs from the signal state of the output signal the output signal has during the predefined time duration, to the evaluating impulse; and a combiner for combining the output signal and the evaluating impulse in order to provide a conditioned output signal, the conditioned output signal having, when an evaluating impulse is present, the impulse signal state thereof and otherwise having the logical signal state of the output signal.

In accordance with a second aspect, the present invention provides an error detection arrangement, having: a signal conditioning arrangement, having: a sensor arrangement for detecting a measured quantity and for outputting an output signal based on the measured quantity, the output signal being able to take on a first or a second logical signal state; a generator for generating an evaluating impulse in order to provide the evaluating impulse if the logical signal state of the output signal does not change for a maximum predefined time duration, and with the generator being further formed to allocate a first or a second impulse signal state, which differs from the signal state of the output signal the output signal has during the predefined time duration, to the evaluating impulse; and a combiner for combining the output signal and the evaluating impulse in order to provide a conditioned output signal, the conditioned output signal having, when an evaluating impulse is present, the impulse signal state thereof and otherwise having the logical signal state of the output signal; and an evaluator for evaluating the conditioned output signal, the evaluator being formed to recognize an error condition of the signal conditioning arrangement if the conditioned output signal maintains a logical signal state for longer than the predefined time duration.

In accordance with a third aspect, the present invention provides a method of conditioning an output signal of a sensor arrangement, the sensor arrangement being formed to sense a measured quantity and to output an output signal based on the measured quantity, the output signal being able to take on a first or a second logical signal state, and the method having the steps of: generating an evaluating impulse in order to provide the evaluating impulse if the logical signal state of the output signal does not change for a maximum predefined time duration, and to allocate a first or a second impulse signal state, which differs from the signal state of the output signal the output signal has during the predefined time duration, to the evaluating impulse; and combining the output signal and the evaluating impulse to provide a conditioned output signal, the conditioned output signal having, when an evaluating impulse is present, the impulse signal state thereof and otherwise having the logical signal state of the output signal.

In accordance with a fourth aspect, the present invention provides a computer program with program code for performing, when the computer program is executed on a computer, a method of conditioning an output signal of a sensor arrangement, the sensor arrangement being formed to sense a measured quantity and to output an output signal based on the measured quantity, the output signal being able to take on a first or a second logical signal state, and the method having the steps of: generating an evaluating impulse in order to provide the evaluating impulse if the logical signal state of the output signal does not change for a maximum predefined time duration, and to allocate a first or a second impulse signal state, which differs from the signal state of the output signal the output signal has during the predefined time duration, to the evaluating impulse; and combining the output signal and the evaluating impulse to provide a conditioned output signal, the conditioned output signal having, when an evaluating impulse is present, the impulse signal state thereof and otherwise having the logical signal state of the output signal.

The present invention provides a signal conditioning arrangement, comprising:
a sensor arrangement for sensing a measured quantity and for outputting an output signal based on the measured quantity, the output signal being able to take on a first or a second logical signal state;
means for generating an evaluation impulse in order to provide the evaluation impulse when the logical signal state of the output signal does not change for a maximum predefined time duration, and wherein means for generating is further formed to allocate a first or a second impulse signal state, which differs from the signal state of the output signal the output signal comprises during the predefined time duration, to the evaluating impulse; and
means for combining the output signal and the evaluating impulse in order to provide a conditioned output signal, the conditioned output signal having, when an evaluating impulse is present, the impulse signal state thereof and otherwise having the logical signal state of the output signal.

Furthermore, the present invention provides a method of conditioning an output signal of a sensor arrangement, the sensor arrangement being formed to sense a measured quantity and output an output signal based on the measured quantity, the output signal being able to take on a first or a second logical signal state, and wherein the method includes the steps of:
generating an evaluating impulse in order to provide the evaluating impulse when the logical signal state of the output signal does not change for a maximum predefined time duration, and to allocate a first or a second impulse signal state, which differs from the signal state of the output signal the output signal has during the predefined time duration, to the evaluating impulse; and
combining the output signal and the evaluating impulse in order to provide an conditioned output signal, the conditioned output signal having, when an evaluating impulse is present, the impulse signal state thereof and otherwise having the logical signal state of the output signal.

The present invention is based on the finding that the absence of error of a sensor arrangement may be checked by outputting an evaluating impulse having a signal state, different from the signal state of the output signal present for the predefined time duration, after elapse of a predefined time duration during which the output signal of the sensor arrangement has not experienced a change in the logical signal state. This enables recognizing an error condition of the sensor arrangement after the predefined time duration at the latest, since, for example, with an interruption of a supply line, such as the VDD line or the ground line, means for combining the output signal and the evaluating impulse would not longer function and thus no change in the signal state of the conditioned output signal can be detected after the predefined time duration at the latest.

Furthermore, as opposed to the prior art, the present invention enables significantly quicker recognition of an error condition of a sensor arrangement, since a pulse width modulated signal or pulse code information no longer have to be evaluated over a time interval, wherein an error condition of the sensor arrangement is then possible only after elapse of the time duration for communication and evaluation of the pulse code information or the pulse width modulated signal. Rather, by the means for generating and combining, which are easy to realize in terms of circuit engineering, sensors can be provided, which enable monitoring such a conditioned output signal.

The inventive signal conditioning arrangement and the inventive method of conditioning an output signal of a sensor arrangement offer the advantage that for recognizing an error condition of the sensor arrangement, as opposed to the prior art, smaller area expense of the semiconductor area is required, that digital, and thus interference-safe, states are used for recognizing an error condition of the sensor arrangement, and that a conditioned output signal can further be evaluated significantly more easily and more temporally accurately in a microprocessor as opposed to the prior art, such as the pulse code information and the pulse width modulation. As a further advantage, it is to be mentioned that now not a limited voltage range characterizes the error-free state of the sensor, but that now the complete dynamic range of the output signal can be used both for transmitting information at a correct mode of operation of the sensor arrangement and for the characterization of an error condition of the sensor arrangement.

It is favorable if means for generating is formed to provide the evaluating impulse maximally for a predetermined impulse duration. This enables high temporal accuracy in the evaluation or monitoring of the output signal.

In a preferred embodiment, the sensor arrangement is formed to maintain a logical signal state for a minimum signal duration. Furthermore, this enables enhanced recognition between the evaluating impulse and the output signal, which leads to an improvement of the temporal accuracy in the evaluation or monitoring of the output signal.

In a preferred embodiment, the maximum predefined impulse duration is smaller than the minimum signal duration. This represents a unique discrimination between the output signal and the evaluating impulse.

Furthermore, the sensor arrangement may be formed to maintain the minimum signal duration shorter than the determined time duration. This ensures that the output signal can be evaluated also in a comparably slow mode of operation, without inferring a malfunction of the signal conditioning arrangement at each output signal output.

Furthermore, the signal conditioning arrangement may also be clocked by a system clock, wherein then the minimum signal duration may be dependent on the system clock. This offers the advantage that, in the presence of a system clocking, this may immediately be used for the determination of the minimum signal duration, which leads to the conversion of a frequency clocking for the sensor arrangement in a saving of hardware expense.

In particular, the maximum impulse duration may be shorter than half a period length of the system clock, which has the advantage that clearer discrimination between an output signal and an evaluating impulse is possible then.

Furthermore, the system clock may include a frequency in the frequency range of 1 Hz to 1 MHz. This frequency range enables reliable recognition and evaluation of a conditioned output signal output from the signal conditioning arrangement, for example, in a microprocessor.

In a further embodiment, means for generating may be formed to generate a further evaluating impulse after the evaluating impulse. This further improves the discrimination between an output signal and an error condition of the signal conditioning arrangement or provides information on the temporal duration of the error condition of the signal conditioning arrangement.

Preferably, means for generating may be formed to generate the further evaluating impulse after the predetermined time duration at the latest, when no change in the logical signal state takes place within the predetermined time duration after the evaluating impulse. This enables the implementation of a timer, which only has to check a single value for the time duration (or all possibly occurring time durations) and is thus easy to realize.

Furthermore, means for generating may also be formed to generate a repetition impulse after the evaluating impulse to be able to uniquely identify the occurrence of an evaluating impulse.

Moreover, the temporal duration between the repetition impulse and the evaluating impulse may be shorter than the minimum signal duration, which leads to an improvement in the temporal accuracy with reference to the occurrence of an output signal edge when an evaluating impulse and an output signal edge occur at the same time.

In a particular embodiment, the sensor arrangement may include a switching sensor. This leads to a favorable evaluation capability of the output signal due to a two-stage (i.e. binary) waveform.

In particular, the switching sensor may be a Hall, pressure, temperature or acceleration sensor. This leads to broad applicability of the signal conditioning arrangement.

Moreover, the sensor arrangement may be formed to clock the switching sensor depending on the system clock. Such an embodiment of the sensor arrangement may support an error or offset compensation of the sensor arrangement.

Furthermore, in a particular embodiment, the evaluating impulse may be output to a further output of the signal conditioning arrangement, which leads to a further improvement of a high temporal resolution capability of a superimposition of an output signal edge and an evaluating impulse.

According to a preferred embodiment, means for generating may be formed to use either the first or the second logical signal state of the output signal as impulse signal state. This enables an easy-to-realize electric circuit, since those signal levels also used for the transmission of information can be used for the detectability of error conditions of the signal conditioning arrangement.

Furthermore, also the sensor arrangement, means for generating, and means for combining may be integrated on a semiconductor chip, which leads to a signal conditioning arrangement easy to realize in terms of production.

According to a further embodiment, the present invention includes an error recognition arrangement, including:

a signal conditioning arrangement according to a previously described embodiment;

means for evaluating the conditioned output signal, the means for evaluating being formed to recognize an error condition of the signal conditioning arrangement when the conditioned output signal maintains a logical signal state longer than for the predefined time duration.

This error recognition arrangement offers the advantage that the error recognition arrangement may perform a self-check and may infer an error condition of the signal conditioning arrangement when a corresponding state of the conditioned output signal is present.

Preferably, the error recognition arrangement includes a microprocessor, wherein means for evaluating is formed in the microprocessor. This has the advantage that, for example, when a microprocessor usable for further applications is present, means for evaluating is also implemented in this microprocessor, and hereby costs, space, and hardware may be saved.

BRIEF DESCRIPTION OF THE DRAWINGS

These and other objects and features of the present invention will become clear from the following description taken in conjunction with the accompanying drawings, in which.

DETAILED DESCRIPTION

Figure 1:
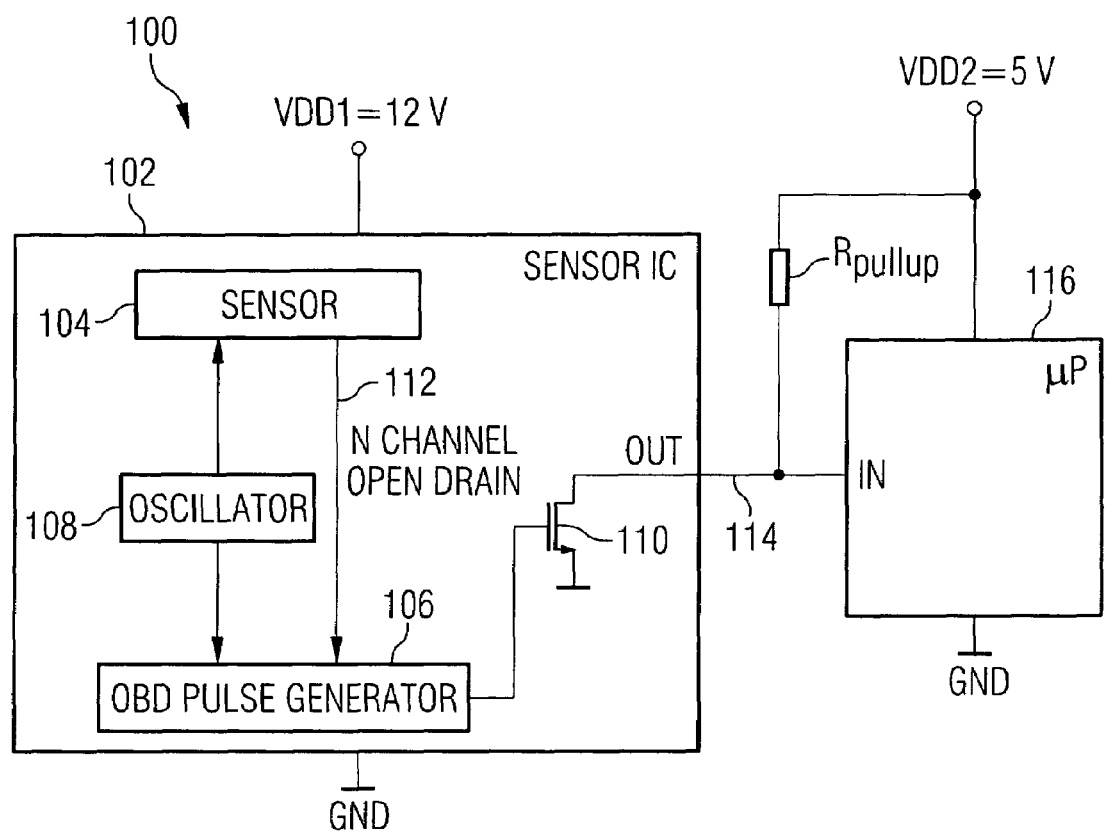
FIG. 1 is a block circuit diagram of an embodiment of the present invention.

FIG. 1 shows the block circuit diagram 100 of an arrangement for recognizing an error condition of a sensor arrangement, using the signal conditioning arrangement 102. The signal conditioning arrangement 102 is alternatively also designated as sensor IC in the following. The signal conditioning arrangement 102 includes a sensor 104, an OBD pulse generator 106, an oscillator 108 coupled to the sensor 104 and the OBD pulse generator 106, and an N channel open drain depletion transistor 110. Furthermore, the signal conditioning arrangement 102 comprises an input VDD1 for applying an operating voltage of e.g. 12 V and a second input for applying a ground potential GND. Furthermore, the signal conditioning arrangement 102 comprises an output OUT connected to the drain terminal of the N channel open drain transistor 110 (enhancement transistor). The source terminal of the N channel enhancement transistor 110 is connected to the ground potential GND, whereas the gate terminal of the N channel enhancement transistor 110 is connected to the OBD pulse generator 106.

Furthermore, the sensor 104 is connected to the OBD pulse generator 106, such that an output signal 112 output by the sensor 104 is fed to the OBD pulse generator 106. Here, the sensor 104 may be regarded as a sensor arrangement, this sensor arrangement measuring a magnetic quantity (i.e. for example is a Hall sensor). But the sensor 104 may also be a pressure/temperature or acceleration sensor. Moreover, the conditioned output signal 114 output by the signal conditioning arrangement 102 at its output OUT may be connected to a second operating voltage VDD2 of, for example, 5 V via a pull-up resistor $R_{pullup}$.

In order to now evaluate the conditioned output signal 114, a first input IN of an optional evaluating means 116 may be connected to the conditioned output signal 114. The optional evaluating means 116 may here be arranged in a microprocessor μP independent of the signal conditioning arrangement 102, for example an on-board computer of a motor vehicle. In order to power the optional evaluating means 116, the evaluating means 116 is connected to the second operating voltage VVD2 of, for example, 5 V at a second input, wherein the evaluating means 116 is connected to the ground potential GND at a third input.

The function of the arrangement illustrated in FIG. 1 using the signal conditioning arrangement 102 may be described as follows:

The sensor IC still only outputs the states "high" or "low", depending on overshoot or undershoot of a switching threshold of the measured quantity monitored by the sensor 104. At over- or undershoot of the threshold, the sensor IC 102 still switches quickly with high temporal resolution using the OBD pulse generator 106 (for example when using toothed-gear sensors in gears as sensor 104 with a temporal resolution corresponding to a sample frequency of 10 kHz). If no signal change of the output signal 112 provided by the sensor 104 is present for a longer time (for example for a time duration of 100 milliseconds to 1 second), in addition to the current state (i.e. the "low" state or the "high" state), an opposite impulse is output rhythmically (i.e. periodically). This impulse is generated in the OBD pulse generator 106, wherein, in the OBD pulse generator when an OBD pulse or evaluating impulse is present, this comprises an impulse signal state different from the signal state of the output signal 112, which has not experienced a signal change for the longer period of time. Furthermore, the signal state of this OBD pulse is then allocated to the conditioned output signal in the OBD pulse generator 106 when an OBD pulse is present, whereas for the case that no OBD pulse is present the conditioned output signal has a signal level corresponding to the signal level of the output signal 112 of the sensor 104 at the corresponding time instant.

This evaluating impulse or OBD pulse, with a time duration of 10 μs, for example, is so short that it lies significantly below the maximum signal frequency, but is also so long in time that it causes a spurious irradiation as low and as low-frequent as possible. For example, an OBD pulse with a temporal width of 10 μs and a period duration of 100 ms (i.e. a repetition frequency after 100 ms) may be clearly discriminated from a 10 kHz signal in a microprocessor, since the signal states in a 10 kHz signal have to be greater than 25-50 μs.

In this connection, the oscillator 108 clocking the sensor 104 and the OBD pulse generator 106 may have a clock frequency through which the OBD pulse width of for example 10 μs is given. The oscillator 108, however, may also be a chopper clock generator with which, for example, a sensor 104 designed as Hall sensor is "chopped", wherein also the OBD pulse generator 106 is then clocked with this chopper frequency provided by the oscillator 108. In such a case, a temporal duration of the maximum impulse width could be performed by a charge and discharge process with an attached comparator, in order to cause an impulse duration preferably smaller than half the minimum signal duration.

Furthermore, matching of the signal level to level regions processable by the evaluation means 116 may take place via the N channel enhancement transistor 110. To this end, the signal output by the OBD pulse generator 106, which already represents a version of the conditioned output signal, is applied to the gate terminal of the enhancement transistor 110, wherein it is then either connected through or disabled with the enhancement transistor 110 by the signal output by the OBD pulse generator 106 depending on the signal level of the signal output from the OBD pulse generator. By the output OUT illustrated in FIG. 1 of the sensor IC being connected to the second operating voltage VDD2 via the pull-up resistor $R_{pullup}$ thus at the first input IN of the evaluating means 116 a signal level of either 5 V (if the further operating voltage is 5 V) or a voltage of 0 V with reference to the ground potential GND is present. The N channel enhancement transistor 110 can thus only be understood as an optional component for converting the conditioned output signal to another voltage region. Furthermore, it is to be noted that the OBD pulse generator 106 in FIG. 1 includes the claimed means for generating the evaluating impulse on the one hand and also the means for combining the output signal with the evaluating impulse on the other hand, since the OBD pulses on the one hand and also the combination of the output signal with the OBD pulses on the other hand take place in the OBD pulse generator.

Figure 2:
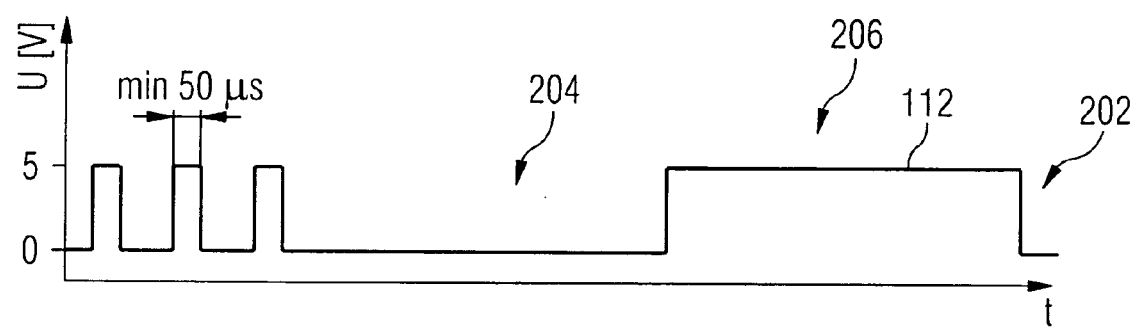
FIG. 2 is a timing diagram each of an output signal output from the sensor arrangement and a conditioned output signal output from means for combining.
Figure 2:
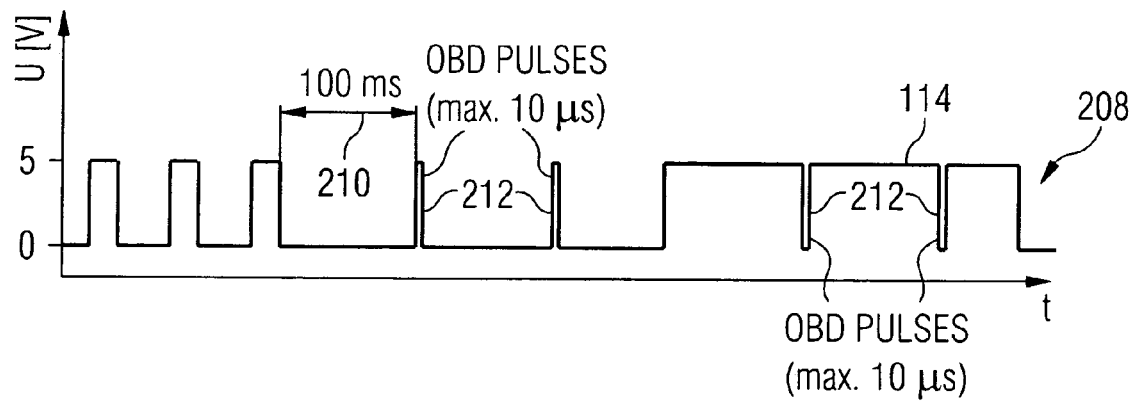

FIG. 2 shows two timing diagrams of waveforms, the upper diagram 202 illustrating the voltage course of the output signal 112 illustrated in FIG. 1 over time t. As has been set forth previously, the impulse duration of the sensor 104 illustrated in FIG. 1 is exemplarily a minimum time duration of 50 μs. In a time region 204 no signal change is registered over a longer time duration, i.e. the signal state in this time region 204 is a constant 0 V. In an ensuing time region 206 again no signal change is registered over a longer time duration, wherein now, however, the signal level of 5 V is kept constant as opposed to the time region 204.

In the lower time diagram 208, the voltage course of the conditioned output signal 114 illustrated in FIG. 1 is illustrated versus time t. Here, the voltage course of the conditioned output signal 114 illustrated in the lower time diagram 208 substantially corresponds to the voltage course of the output signal 112 illustrated in the upper time diagram 202, wherein now, however, after the predefined time duration 210 of, for example, 100 ms, an OBD pulse 212 is combined with the voltage course illustrated in the upper time diagram 202. This OBD pulse 212, for example, comprises a maximum temporal width of 10 µs and, for example, has a period duration of also 100 ms. This means that after a time duration corresponding to the predefined time duration of, for example, 100 ms in which the signal state of the output signal 112 illustrated in FIG. 1 does not change an OBD pulse 112 occurs in the conditioned output signal 114 at the latest, wherein the impulse signal state of the OBD pulse differs from that signal state of the output signal 112 which has not changed over the predefined time duration. Hereby, in the lower time diagram 208, an impulse signal state of, for example, 5 V in the time region 204 results, since in this time region the signal state of the output signal 112 has a level of 0 V. On the other hand, an impulse signal state of the OBD pulse 112 in the further time region 206 of 0 V results, since in this time region the signal state of the output signal 112 has a level of 5 V.

Furthermore, also in an embodiment, the OBD impulse may additionally also be output separately in order to again increase, for example, the evaluation capability of the conditioned output signal or cause improvement of the recognition of a change of output signal edge.

Depending on conditions, the inventive method of conditioning an output signal of a sensor arrangement may be implemented in hardware or in software. The implementation may take place on a digital storage medium, in particular a floppy disc or CD with electronically readable control signals able to cooperate with a programmable computer system so that the corresponding method is executed. In general, the invention thus also consists in a computer program product with program code stored on a machine-readable carrier for the execution of the inventive method, when the computer program product is executed on a computer. In other words, the invention may thus be realized as a computer program with program code for the execution of the method, when the computer program is executed on a computer.

In summary, it may be noted that in the present invention a digital OBD impulse is output when no signal change takes place over a fixed period of time. Furthermore, these pulses preferably output as digital pulses can be repeated cyclically when no signal change has again taken place after an output OBD impulse for the fixed period of time. Furthermore, the OBD impulses may be significantly shorter than the shortest input signal. If there are signal changes within the fixed period of time, no opposite OBD signal (i.e. no evaluating impulse) is output. The signal change itself may then be recognized in a microprocessor as OBD. With line breakage at the output, the operating voltage supply VDD or the ground potential terminal, or short circuit between two pins, neither signal change nor OBD impulse occur. As a result, erroneous behavior of the sensor arrangement or the signal conditioning arrangement is recognized in the microprocessor after 100 ms, for example. If the OBD pulses further accidentally come to rest within a subsequently occurring signal edge (i.e. within the next tooth edge when using a toothed-gear sensor of a gear), only a one-time temporal edge insecurity of the maximum length of the OBD impulse (i.e. of a maximum of 10 µs in the case chosen here) results. All further impulses again possess the very exact edge resolution of, for example, 1 µs.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A signal conditioning arrangement, comprising:
    a sensor arrangement for detecting a measured quantity and for outputting an output signal based on the measured quantity, the output signal being able to take on a first or a second logical signal state;
    a generator for generating an evaluating impulse if the logical signal state of the output signal does not change for a maximum predefined time duration, wherein the evaluating impulse has a respective impulse signal state different from the signal state of the output signal during the predefined time duration; and
    a combiner for combining the output signal and the evaluating impulse in order to provide a conditioned output signal, the conditioned output signal comprising, when an evaluating impulse is present, said respective impulse signal state or the logical signal state of the output signal.

2. The signal conditioning arrangement of claim 1, wherein the generator is formed to provide the evaluating impulse for maximally a predetermined impulse duration.

3. The signal conditioning arrangement of claim 1, wherein the sensor arrangement is formed to maintain a logical signal state for a minimum signal duration.

4. The signal conditioning arrangement of claim 2, wherein the maximum predefined impulse duration is smaller than the minimum signal duration.

5. The signal conditioning arrangement of claim 3, wherein the sensor arrangement is formed to keep the minimum signal duration shorter than the predetermined time duration.

6. The signal conditioning arrangement of claim 3, which is clocked by a system clock, the minimum signal duration being dependent on the system clock.

7. The signal conditioning arrangement of claim 4, wherein the maximum impulse duration is shorter than half a period length of the system clock.

8. The signal conditioning arrangement of claim 6, wherein the system clock includes a frequency in the frequency range of 1 Hz to 1 MHz.

9. The signal conditioning arrangement of claim 1, wherein the generator is formed to generate a further evaluating impulse after the evaluating impulse.

10. The signal conditioning arrangement of claim 9, wherein the generator is formed to generate the further evaluation impulse after the predetermined time duration at the latest if no change in the logical signal state takes place within the predefined time duration after the evaluating impulse.

11. The signal conditioning arrangement of claim 3, wherein the generator is formed to generate a repetition impulse after the evaluating impulse.

12. The signal conditioning arrangement of claim 11, wherein a temporal duration between the repetition impulse and the evaluating impulse is shorter than the minimum signal duration.

13. The signal conditioning arrangement of claim 1, wherein the sensor arrangement includes a switching sensor or a Hall sensor.

14. The signal conditioning arrangement of claim 13, wherein the switching sensor is a pressure, temperature, or acceleration sensor.

15. The signal conditioning arrangement of claim 6, wherein the sensor arrangement is formed to clock the switching sensor or the Hall sensor depending on the system clock.

16. The signal conditioning arrangement of claim 1, further formed to output the evaluating impulse to a further output of the signal conditioning arrangement.

17. The signal conditioning arrangement of claim 1, wherein the generator is formed to use either a first or a second logical signal state of the output signal as the respective impulse signal state.

18. The signal conditioning arrangement of claim 1, wherein the sensor arrangement, the generator, and the combiner are integrated on a semiconductor chip.

19. An error detection arrangement, comprising:
   a signal conditioning arrangement, comprising:
      a sensor arrangement for detecting a measured quantity and for outputting an output signal based on the measured quantity, the output signal being able to take on a first or a second logical signal state;
      a generator for generating an evaluating impulse if the logical signal state of the output signal does not change for a maximum predefined time duration, wherein the evaluating impulse has a first or a second impulse signal state, which differs from the signal state of the output signal during the predefined time duration; and
      a combiner for combining the output signal and the evaluating impulse in order to provide a conditioned output signal, the conditioned output signal having, when an evaluating impulse is present, the impulse signal state thereof and otherwise having the logical signal state of the output signal; and
   an evaluator for evaluating the conditioned output signal, the evaluator being formed to recognize an error condition of the signal conditioning arrangement if the conditioned output signal maintains a logical signal state for longer than the predefined time duration.

20. The error detection arrangement of claim 19, further comprising a microprocessor, with the evaluator being formed in the microprocessor.

21. A method of conditioning an output signal of a sensor arrangement, the sensor arrangement being formed to sense a measured quantity and to output an output signal based on the measured quantity, the output signal being able to take on a first or a second logical signal state, and the method comprising the steps of:
   generating an evaluating impulse if the logical signal state of the output signal does not change for a maximum predefined time duration, wherein the evaluating impulse comprises a signal state different from the logical signal state of the output signal during the predefined time duration; and
   combining the output signal and the evaluating impulse to provide a conditioned output signal.

22. A computer program product comprising a storage medium storing program code for performing, when the program code is executed on a computer, a method of conditioning an output signal of a sensor arrangement, the sensor arrangement being formed to sense a measured quantity and to output an output signal based on the measured quantity, the output signal being able to take on a first or a second logical signal state, and the method comprising the steps of:
   generating an evaluating impulse if the logical signal state of the output signal does not change for a maximum predefined time duration, wherein the evaluating impulse comprises a signal state different from the logical signal state of the output signal during the predefined time duration; and
   combining the output signal and the evaluating impulse to provide a conditioned output signal.

\* \* \* \* \*

UNITED STATES PATENT AND TRADEMARK OFFICE
CERTIFICATE OF CORRECTION

PATENT NO. : 7,333,915 B2 Page 1 of 1
APPLICATION NO. : 11/222184
DATED : February 19, 2008
INVENTOR(S) : Mario Motz It is certified that error appears in the above-identified patent and that said Letters Patent is hereby corrected as shown below:

Column 11, line 18: Please replace the word "outpuffing" with the word --outputting--.

Signed and Sealed this

Third Day of June, 2008

JON W. DUDAS
*Director of the United States Patent and Trademark Office*